United States Patent
Zhang et al.

(10) Patent No.: US 11,360,627 B2
(45) Date of Patent: Jun. 14, 2022

(54) TOUCH SUBSTRATE, METHOD OF FORMING THE SAME, AND TOUCH DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Zerui Zhang, Beijing (CN); Hyoungseok Park, Beijing (CN); Haoyuan Fan, Beijing (CN); Xinkun Yan, Beijing (CN); Yanchun Xie, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 90 days.

(21) Appl. No.: 17/032,945

(22) Filed: Sep. 25, 2020

(65) Prior Publication Data
US 2021/0089171 A1    Mar. 25, 2021

(30) Foreign Application Priority Data
Sep. 25, 2019   (CN) ........................ 201910911581.7

(51) Int. Cl.
*G06F 3/045*    (2006.01)
*G06F 3/044*    (2006.01)
(Continued)

(52) U.S. Cl.
CPC .......... *G06F 3/0446* (2019.05); *H01L 27/323* (2013.01); *H01L 27/3244* (2013.01);
(Continued)

(58) Field of Classification Search
CPC ...... G06F 3/0412; G06F 3/044; G06F 3/0443; G06F 3/0446; G06F 2203/04102;
(Continued)

(56) References Cited

U.S. PATENT DOCUMENTS

| | | | |
|---|---|---|---|
| 11,112,913 B2 * | 9/2021 | Chen ...................... | G06F 3/0446 |
| 2013/0194205 A1 * | 8/2013 | Park ...................... | G06F 3/0446 345/173 |

(Continued)

FOREIGN PATENT DOCUMENTS

| | | | | |
|---|---|---|---|---|
| CN | 107342370 B | * | 5/2019 | ........... G06F 3/0412 |
| WO | WO-2019184427 A1 | * | 10/2019 | ........... G06F 3/0412 |

*Primary Examiner* — Joe H Cheng
(74) *Attorney, Agent, or Firm* — Muncy, Geissler, Olds & Lowe, P.C.

(57) ABSTRACT

A touch substrate, a method of forming the same, and a touch display device are provided. A touch substrate is provided, including: a flexible base substrate; and a touch electrode layer, an insulating layer and a conductive connection layer stacked in a direction away from the flexible base substrate. The conductive connection layer includes a plurality of second conductive connection components; the touch electrode layer includes touch electrode columns and touch electrode rows arranged crosswise and insulated from each other; each of the touch electrode columns includes a plurality of first touch electrode patterns arranged in a column direction, two adjacent first touch electrode patterns in an identical touch electrode column are coupled via a first conductive connection component in the touch electrode layer.

20 Claims, 3 Drawing Sheets

(51) Int. Cl.
*H01L 27/32* (2006.01)
*H01L 51/00* (2006.01)

(52) U.S. Cl.
CPC ............... *H01L 51/0097* (2013.01); *G06F 2203/04102* (2013.01); *G06F 2203/04103* (2013.01); *H01L 2251/5338* (2013.01)

(58) Field of Classification Search
CPC . G06F 2203/04103; G06F 2203/04111; H01L 27/323; H01L 27/3244; H01L 51/0097; H01L 2251/5338; Y02E 10/549; Y02P 70/50
See application file for complete search history.

(56) References Cited

U.S. PATENT DOCUMENTS

| | | | | |
|---|---|---|---|---|
| 2014/0354906 | A1* | 12/2014 | Wu | G06F 3/0443 349/12 |
| 2015/0122771 | A1* | 5/2015 | Teramoto | H01L 21/311 216/17 |
| 2016/0018935 | A1* | 1/2016 | Wei | H01L 29/78633 345/173 |
| 2017/0269750 | A1* | 9/2017 | Kang | G02F 1/13439 |
| 2019/0369784 | A1* | 12/2019 | Yao | H01L 27/3211 |
| 2020/0026382 | A1* | 1/2020 | Zhang | H05K 3/326 |
| 2020/0411608 | A1* | 12/2020 | Tang | H01L 27/3227 |

* cited by examiner

TOUCH SUBSTRATE, METHOD OF FORMING THE SAME, AND TOUCH DISPLAY DEVICE

CROSS REFERENCE OF RELATED APPLICATION

The present disclosure claims a priority to Chinese Patent Application No. 201910911581.7 filed on Sep. 25, 2019, the disclosures of which are incorporated in their entirety by reference herein.

TECHNICAL FIELD

The present disclosure relates to field of touch technology, in particular to a touch substrate, a method of forming the same, and a touch display device.

BACKGROUND

Organic light-emitting diodes display screens are widely used in various fields due to their self-luminous, fast response speed, flexibility, wide color gamut, and high luminous efficiency. At the same time, in order to meet the needs of more application scenarios, the touch technology is also integrated into the OLED display in related art to achieve a flexible touch display. However, various parts of the flexible touch display are unevenly stressed, which makes the pressure difference between the various film layers in the touch display screen, and causes the conductive function pattern used to realize the touch function in the touch display screen to be easily fractured, resulting in reducing the use yield of the touch screen display.

SUMMARY

A touch substrate is provided, including:
a flexible base substrate; and
a touch electrode layer, an insulating layer and a conductive connection layer stacked in a direction away from the flexible base substrate; where
the conductive connection layer includes a plurality of second conductive connection components;
the touch electrode layer includes touch electrode columns and touch electrode rows arranged crosswise and insulated from each other;
each of the touch electrode columns includes a plurality of first touch electrode patterns arranged in a column direction, two adjacent first touch electrode patterns in an identical touch electrode column are coupled via a first conductive connection component in the touch electrode layer;
each of the touch electrode rows includes a plurality of second touch electrode patterns arranged in a row direction, each of the touch electrode rows includes a plurality of touch electrode groups, each touch electrode group includes two adjacent second touch electrode patterns in the touch electrode row, and the touch electrode groups are in a one-to-one correspondence to the second conductive connection components;
an orthographic projection of each of the two second touch electrode patterns of each touch electrode group onto the flexible base substrate overlaps an orthographic projection of the corresponding second conductive connection component onto the flexible base substrate at a first overlapping region, and each of the two second touch electrode patterns of each touch electrode group is coupled to the second conductive connection component via a first via-hole in the insulating layer at the first overlapping region.

Optionally, the insulating layer includes an organic insulating layer.

Optionally, the organic insulating layer includes an organic resin layer.

Optionally, each first touch electrode pattern includes a plurality of layers of conductive metal sub-patterns stacked in a direction perpendicular to the flexible base substrate; each second touch electrode pattern includes a plurality of layers of conductive metal sub-patterns stacked in the direction perpendicular to the flexible base substrate; and/or the second conductive connection component includes a plurality of layers of conductive metal sub-patterns stacked in the direction perpendicular to the flexible base substrate.

Optionally, the conductive connection layer further includes an extension portion extending from each of the second conductive connection components, and an orthographic projection of the extension portion onto the flexible base substrate overlaps the orthographic projection of at least one second touch electrode pattern of the corresponding touch electrode group onto the flexible base substrate at a second overlapping region, and the extension portion is coupled to the at least one second touch electrode pattern via a second via-hole at the second overlapping region.

Optionally, a width of the first conductive connection component in a first direction is smaller than a width of each first touch electrode pattern in the first direction, where the first direction is perpendicular to an extending direction of each of the touch electrode columns.

Optionally, an orthographic projection of the first conductive connection component onto the flexible base substrate overlaps with the orthographic projection of the corresponding second conductive connection component onto the flexible base substrate.

Optionally, a width of each second conductive connection component in a second direction is smaller than a width of each second touch electrode pattern in the second direction, where the second direction is perpendicular to an extending direction of each of the touch electrode rows.

Optionally, each first touch electrode pattern includes a first metal conductive layer and a second metal conductive layer which are arranged in a stacked manner.

Optionally, each second touch electrode pattern includes a third metal conductive layer and a fourth metal conductive layer which are arranged in a stacked manner, and/or each second conductive connection component includes a fifth metal conductive layer and a sixth metal conductive layer which are arranged in a stacked manner.

A touch display device including the touch substrate hereinabove is further provided.

Optionally, the touch display device further includes a flexible display substrate, where the touch substrate and the flexible display substrate are stacked at a display side of the flexible display substrate.

Optionally, the flexible display substrate is used as the flexible base substrate of the touch substrate.

A method of forming a touch substrate is further provided, applied to form the touch substrate hereinabove, where the method includes:
forming a touch electrode layer on a flexible base substrate, where the touch electrode layer includes touch electrode columns and touch electrode rows arranged crosswise and insulated from each other; where each of the touch electrode columns includes a plurality of first touch electrode patterns arranged in a column direction, two adjacent first touch electrode patterns in an identical touch electrode column are coupled via a first conductive connection component in the touch electrode layer; each of the touch electrode rows includes a plurality of second touch electrode patterns arranged in a row direction, each of the touch electrode rows includes a plurality of touch electrode groups, and each touch electrode group includes two adjacent second touch electrode patterns in the touch electrode row;

forming an insulating layer at a side of the touch electrode layer away from the flexible base substrate, and forming a plurality of first via-holes in the insulating layer; and forming a conductive connection layer at a side of the insulating layer away from the flexible base substrate, where the conductive connection layer includes a plurality of second conductive connection components, the touch electrode groups are in a one-to-one correspondence to the second conductive connection components, an orthographic projection of each of the two second touch electrode patterns of each touch electrode group onto the flexible base substrate overlaps an orthographic projection of the corresponding second conductive connection component onto the flexible base substrate at a first overlapping region, and each of the two second touch electrode patterns of each touch electrode group is coupled to the second conductive connection component via the first via-hole in the insulating layer at the first overlapping region.

Optionally, the insulating layer includes an organic insulating layer, and the forming the first via-holes in the insulating layer includes:

forming an organic insulating material film;

exposing the organic insulating material film by a mask having a light-transmitting area and a light-shielding area, to form an organic insulating material film reserving area and an organic insulating material film removing area, where the organic insulating material film removing area corresponds to a region of the first via-hole, and the organic insulating material reserving area corresponds to other regions excepting the region of the first via-hole; and developing the exposed organic insulating material film, to remove the organic insulating material film in the organic insulating material film removing area to form the organic insulating layer.

BRIEF DESCRIPTION OF THE DRAWINGS

The drawings described here are used to provide a further understanding of the present disclosure and constitute a part of the present disclosure. The exemplary embodiments and descriptions of the present disclosure are used to explain the present disclosure, and do not constitute an improper limitation of the present disclosure.

DETAILED DESCRIPTION

In order to further explain the touch substrate and the method of forming the same, and the touch display device in the embodiments of the present disclosure, a detailed description will be given below with reference to the drawings.

Figure 1:
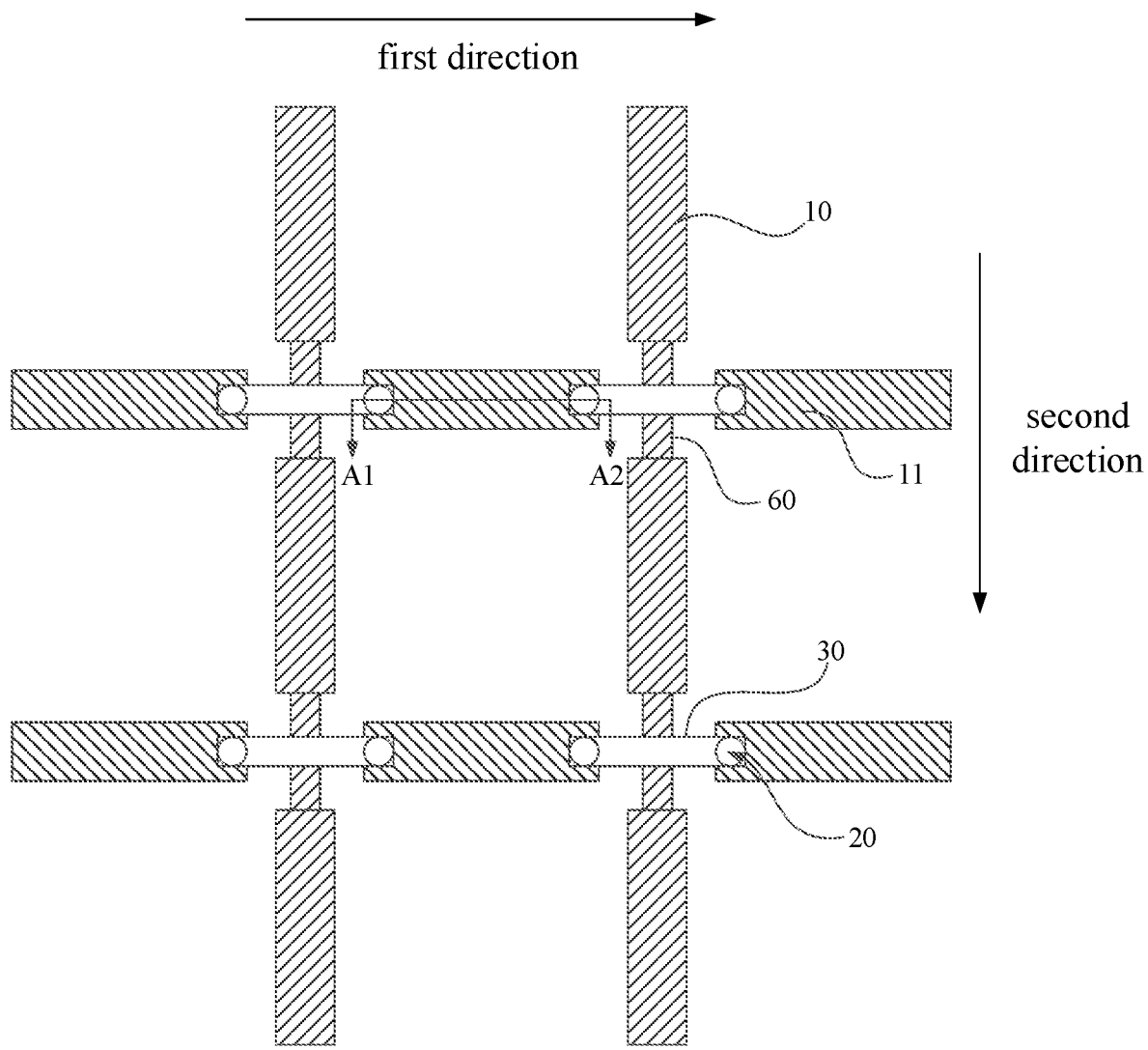
FIG. 1 is a first schematic top view of a touch substrate in an embodiment of the present disclosure.
Figure 2:
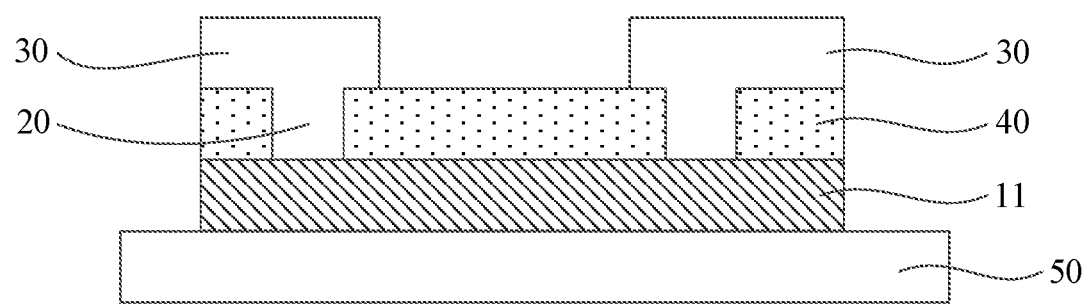
FIG. 2 is a schematic cross-sectional view along the A1-A2 direction in FIG. 1.

As shown in FIG. 1 and FIG. 2, a touch substrate is provided, including: a flexible base substrate 50; and a touch electrode layer, an insulating layer 40 and a conductive connection layer stacked in a direction away from the flexible base substrate. The conductive connection layer includes a plurality of second conductive connection components 30; the touch electrode layer includes touch electrode columns and touch electrode rows arranged crosswise and insulated from each other; each of the touch electrode columns includes a plurality of first touch electrode patterns 10 arranged in a column direction, two adjacent first touch electrode patterns 10 in an identical touch electrode column are coupled via a first conductive connection component in the touch electrode layer; each of the touch electrode rows includes a plurality of second touch electrode patterns 11 arranged in a row direction, each of the touch electrode rows includes a plurality of touch electrode groups, each touch electrode group includes two adjacent second touch electrode patterns 11 in the touch electrode row, and the touch electrode groups are in a one-to-one correspondence to the second conductive connection components 30; an orthographic projection of each of the two second touch electrode patterns 11 of each touch electrode group onto the flexible base substrate overlaps an orthographic projection of the corresponding second conductive connection component 30 onto the flexible base substrate at a first overlapping region, and each of the two second touch electrode patterns 11 of each touch electrode group is coupled to the second conductive connection component 30 via a first via-hole 20 in the insulating layer at the first overlapping region.

Specifically, the specific shapes of the first touch electrode patterns 10 included in the touch electrode column and the second touch electrode patterns 11 included in the touch electrode rows are various, for example, both the first touch electrode pattern 10 and the second touch electrode pattern 11 are rectangular or rhombic.

The first touch electrode pattern 10 and the second touch electrode pattern 11 are arranged in the same layer, and the first touch electrode pattern 10 and the second touch electrode pattern 11 are insulated from each other, and the touch electrode rows are insulated from each other, and the touch electrode columns are insulated from each other.

As shown in FIG. 1, two adjacent first touch electrode patterns 10 in the same touch electrode column may be directly coupled, that is, two adjacent first touch electrode patterns 10 in the same touch electrode column are coupled via a first conductive connection component 60 at the same layer and made of the same material with the first touch electrode patterns 10. The first conductive connection component 60 and the first touch electrode pattern 10 may be formed in the same patterning process, and a width of the first conductive connection component 60 in the direction perpendicular to the column is smaller than that of the first conductive connection component 10.

For example, as shown in FIG. 1, a width of the first conductive connection component 60 in a first direction is smaller than a width of each first touch electrode pattern 10 in the first direction, where the first direction is perpendicular to an extending direction of each of the touch electrode columns.

Two adjacent second touch electrode patterns 11 in the same touch electrode row may be coupled by a corresponding second conductive connection component 30, and the second conductive connection component 30 may also be referred to as a connecting bridge. The width of the second conductive connection component 30 in the direction perpendicular to the row is smaller than the width of the second touch electrode pattern 11.

For example, as shown in FIG. 1, a width of each second conductive connection component 30 in a second direction is smaller than a width of each second touch electrode pattern 11 in the second direction, where the second direction is perpendicular to an extending direction of each of the touch electrode rows.

The touch electrode rows and the touch electrode columns may cross at any position. For example, the second conductive connection components 30 in each touch electrode row are in a one-to-one correspondence to the first conductive connection components in each touch electrode column, the orthographic projection of the second conductive connection component 30 onto the flexible base substrate overlaps the orthographic projection of the corresponding first conductive connection component onto the flexible base substrate, and the overlapping position is where the touch electrode row interests with the touch electrode column.

Each of the touch electrode rows includes a plurality of groups of touch electrode groups, and each group includes two adjacent second touch electrode patterns 11 in the touch electrode row, that is, in each touch electrode row, excepting for the second touch electrode patterns 11 located at two ends thereof, the remaining second touch electrode patterns 11 in the touch electrode row belong to two touch electrode groups. The second touch electrode patterns 11 may be coupled in the direction of touch electrode row through the second conductive connection components 30.

Since the second touch electrode pattern 11 and the second conductive connection portion 30 are arranged at different layers, an orthographic projection of each of the two second touch electrode patterns 11 of each touch electrode group onto the flexible base substrate overlaps an orthographic projection of the corresponding second conductive connection component 30 onto the flexible base substrate at a first overlapping region, and then each of the two second touch electrode patterns 11 of each touch electrode group is coupled to the second conductive connection component 30 via a first via-hole 20 penetrating the insulating layer 40 at the first overlapping region.

In the touch substrate with the above structure, a capacitor structure is formed between the adjacent first touch electrode pattern 10 and the second touch electrode pattern 11. When the touch substrate is touched at the side of the conductive connection layer, the capacitance value of the capacitance structure corresponding to the touch position changes and the change of the capacitance value is fed back to the chip corresponding to the touch substrate. The chip determines the specific touch position according to the position where the capacitance value changes.

According to the touch substrate in the present disclosure, the touch substrate includes a touch electrode layer, an insulating layer 40 and a conductive connection layer that are sequentially stacked on the flexible base substrate in a direction away from the flexible base substrate. Since the touch electrode layer is disposed between the flexible base substrate and the insulating layer 40, the conductive connection layer is disposed on the surface of the insulating layer 40 away from the flexible base substrate, so that the touch electrode layer is closer to the flexible base substrate than the conductive connection layer, so that when the touch substrate needs to be bent during application, the touch electrode layer receives less bending stress, which reduces the damage probability of the first touch electrode pattern 10 and the second touch electrode pattern 11 included in the touch electrode layer; and although the conductive connection layer is far away from the flexible base substrate, the number of the second conductive connection portions 30 of the conductive connection layer is small and the distribution thereof is relatively sparse. Therefore, the probability of damage is also small when the touch substrate is bent.

In addition, in the touch substrate in the present disclosure, the touch electrode layer, the insulating layer 40, and the conductive connection layer are sequentially stacked on the flexible base substrate in a direction away from the flexible base substrate, so that when the second touch electrode pattern 11 in the touch electrode layer is coupled to the corresponding second conductive connection component 30 through the corresponding first via-hole 20, the influence of the slope angle of the via-hole 20 on the coupling between the second touch electrode pattern 11 and the second conductive connection portion 30 may be weakened, and the probability of disconnection between the second touch electrode pattern 11 and the second conductive connections 30 caused by the bending operation is reduced.

In some embodiments of the present disclosure, the insulating layer 40 may include an organic insulating layer.

Specifically, the material of the insulating layer 40 may be selected according to actual needs. Illustratively, the insulating layer 40 may be an inorganic insulating layer or an organic insulating layer. When the insulating layer 40 is an inorganic insulating layer, Si3N4 (silicon nitride) may be used to make the inorganic insulating layer. When the insulating layer 40 is an organic insulating layer, an organic OC (over coating) glue may be used to make the organic insulating layer. In other words, an organic resin layer may be made of the organic insulating layer, but it is not limited to this.

In addition, when selecting the material for the organic insulating layer, the viscosity of the organic insulating layer made of this material should be considered at the same time, and the organic material with higher viscosity may be used as much as possible to make the organic insulating layer, to make the bonding performance better.

When the insulating layer 40 is an organic insulating layer, the forming the organic insulating layer specifically includes:

First, an organic insulating material is used to make an organic insulating material film; then a mask including a light-transmitting area and a light-shielding area is aligned with the organic insulating material film, and the organic insulating material film is exposed by the mask, An organic insulating material film reserving area and an organic insulating material film removing area are formed. The organic insulating material film removing area corresponds to the area where the first via-hole 20 is located, and the organic insulating material reserving area corresponds to the area other than the area where the via-hole 20 is located. Finally, the exposed organic insulating material film is developed with a developer to remove the organic insulating material film located in the organic insulating material film removing area to form the organic insulating layer with the first via-hole 20.

In the touch substrate in some embodiments of the present disclosure, the insulating layer 40 includes an organic insulating layer, so that the insulating layer 40 between the touch electrode layer and the conductive connection layer has a small film stress, even when the touch substrate is bent at a relatively large angle, the insulating layer 40 is not prone to be fractured. Moreover, when the insulating layer 40 includes an organic insulating layer, when the first via-hole 20 is formed in the organic insulating layer, only exposure and development processes are required, and no etching process is required, so that the forming of the slope angle of the first via-hole 20 is easier to be controlled, and the first via-hole 20 has a higher accuracy, so as to avoid the disconnection or poor contact between the second touch electrode pattern 11 and the second conductive connection component 30 when the slope angle of the first via-hole 20 is large, thereby ensuring that the touch substrate has good touch performance and usage yield.

The material and structure of the first touch electrode pattern 10 and the second touch electrode pattern 11 may be determined according to actual needs, as long as it is ensured that the first touch electrode pattern 10 and the second touch electrode pattern 10 have good conductivity. In some embodiments of the present disclosure, the first touch electrode pattern 10 may be arranged to include a plurality of layers of conductive metal sub-patterns stacked in a direction perpendicular to the flexible base substrate; the second touch electrode pattern 11 includes a plurality of layers of conductive metal sub-patterns stacked in the direction of the flexible base substrate; and/or, the second conductive connection component 30 includes a plurality of layers of conductive metal sub-patterns stacked in the direction perpendicular to the flexible base substrate.

Figure 4A:
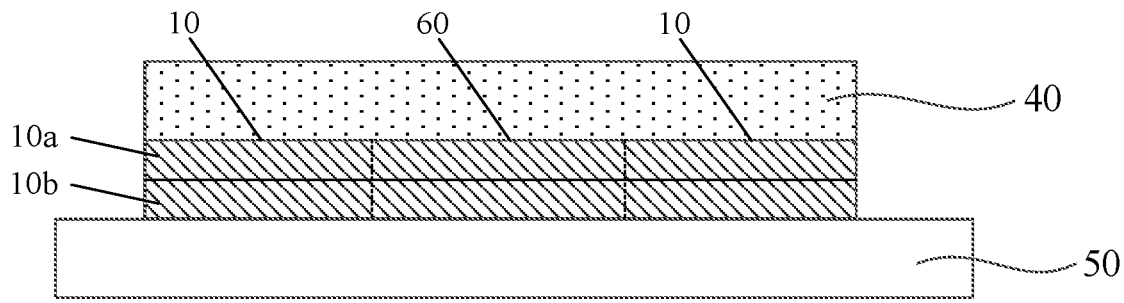
FIG. 4a is a schematic cross-sectional view along the B1-B2 direction in FIG. 1.

For example, as shown in FIG. 4a, the first touch electrode pattern 10 includes a first metal conductive layer 10a and a second metal conductive layer 10b which are arranged in a stacked manner.

Figure 4B:
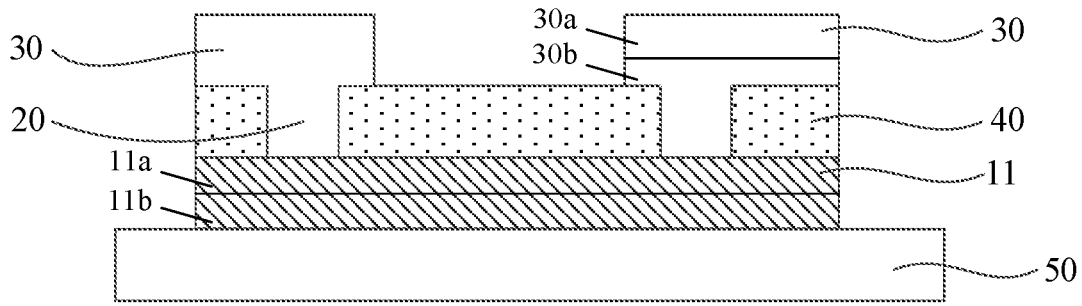
FIG. 4b is a schematic cross-sectional view along the A1-A2 direction in FIG. 1.
Figure 5:
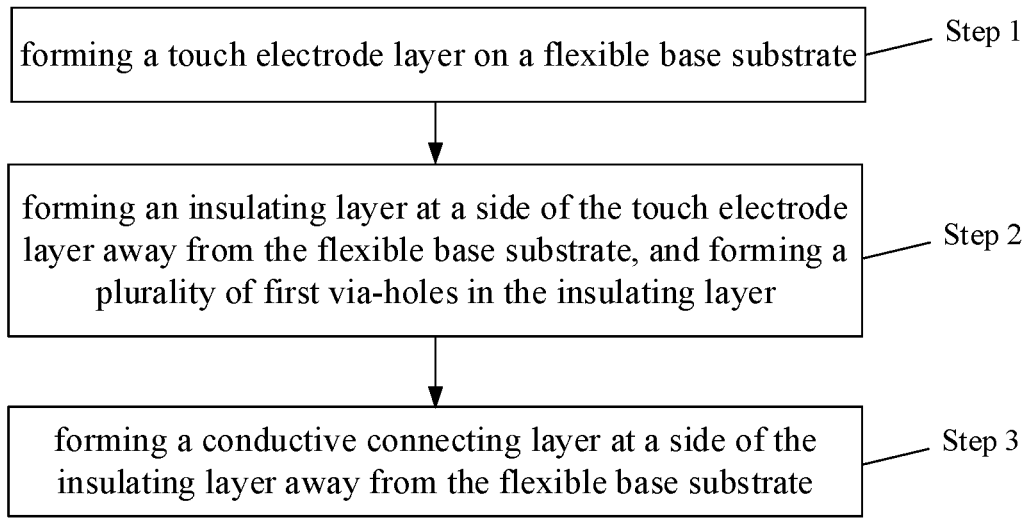
FIG. 5 is a flow chart of a method of forming a touch substrate in an embodiment of the present disclosure.

As shown in FIG. 4b, the second touch electrode pattern 11 includes a third metal conductive layer 11a and a fourth metal conductive layer 11b which are arranged in a stacked manner, and/or the second conductive connection component 30 includes a fifth metal conductive layer 30a and a sixth metal conductive layer 30b which are arranged in a stacked manner.

Therefore, the first touch electrode pattern 10, the second touch electrode pattern 11, and/or the second conductive connection component 30 are configured to include a plurality of layers of conductive metal sub-patterns stacked in a direction perpendicular to the flexible base substrate, not only the first touch electrode pattern 10, the second touch electrode pattern 11 and/or the second conductive connection portion 30 have a good conductivity, but also the first touch electrode pattern 10, the second touch electrode pattern 11, and/or the second conductive connection component 30 are not prone to be fractured when the touch substrate is bent, thereby ensuring the use yield of the touch substrate and prolonging the service life of the touch substrate.

When the first touch electrode pattern 10, the second touch electrode pattern 11, and/or the second conductive connection portion 30 are configured to include a plurality of layers of conductive metal sub-patterns stacked in the direction perpendicular to the flexible base substrate, the forming the plurality of layers of conductive metal sub-patterns includes:

a plurality of layers of conductive metal film are sequentially deposited on the flexible base substrate, a photoresist is formed on the conductive metal film furthest away from the flexible base substrate, and a mask including a light-transmitting area and a light-shielding area is used to expose photoresist to form a photoresist removing area and a photoresist reserving area, where the photoresist reserving area corresponds to the area where the conductive metal sub-pattern to be formed is located, and the photoresist removing area corresponds to other areas excepting the area where the conductive metal sub-patterns are located; the photoresist located in the photoresist removing area is removed by a developer, and then the photoresist located in the photoresist reserving area is taken as a mask for etching the plurality of layers of conductive metal film, to remove a plurality of layers of conductive metal film located in the photoresist removing area, and finally the photoresist located in the photoresist reserving area is peeled off to form the a plurality of layers of conductive metal sub-pattern.

For example, the plurality of layers of conductive metal sub-pattern may include titanium metal sub-patterns, aluminum metal sub-patterns, and titanium metal sub-patterns stacked in sequence, but it is not limited thereto.

Figure 3:
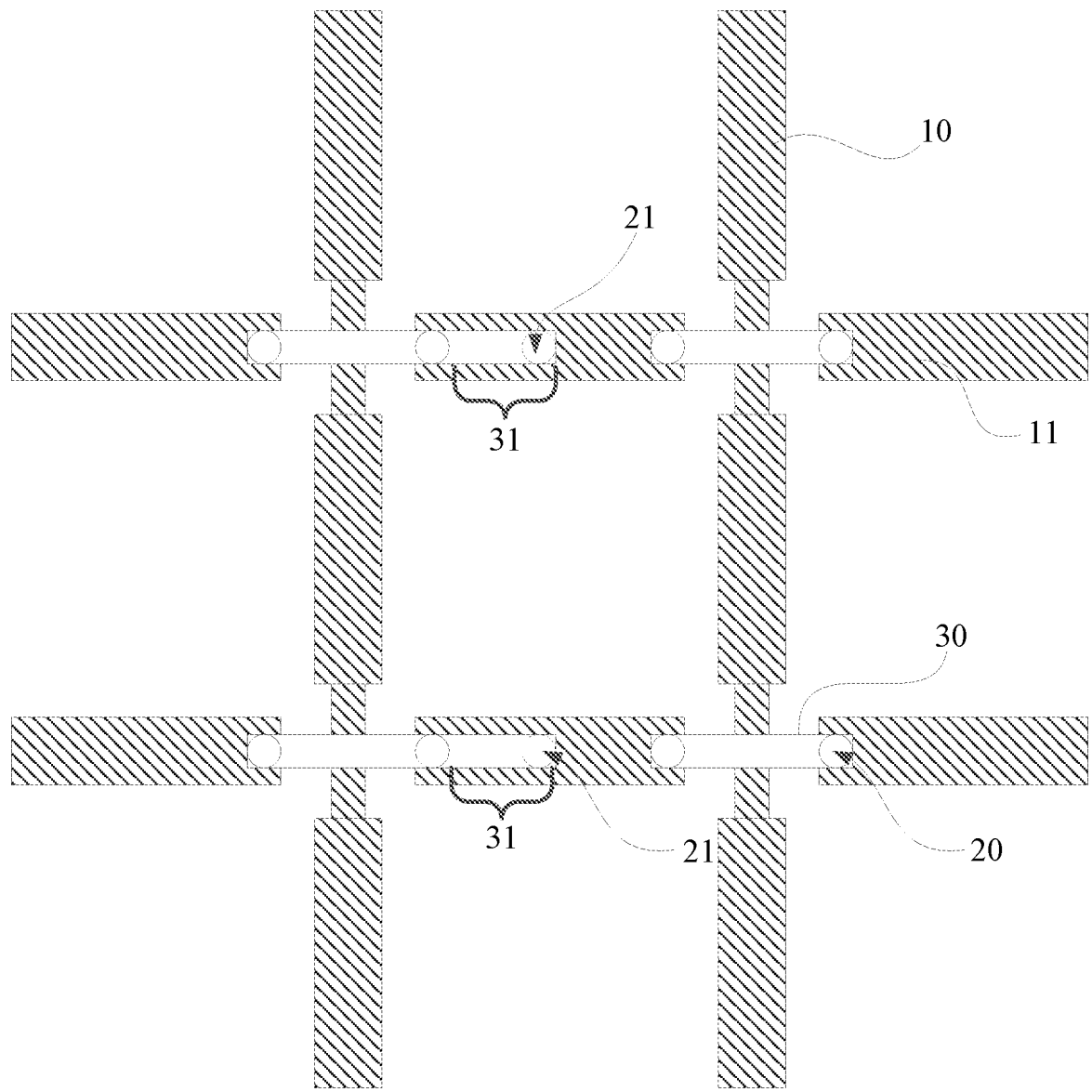
FIG. 3 is a second schematic top view of a touch substrate in an embodiment of the present disclosure.

As shown in FIG. 3, in some embodiments of the present disclosure, the conductive connection layer further includes an extension portion 31 extending from each of the second conductive connection components 30, and an orthographic projection of the extension portion 31 onto the flexible base substrate overlaps the orthographic projection of at least one second touch electrode pattern 11 of the corresponding touch electrode group onto the flexible base substrate at a second overlapping region, and the extension portion 31 is coupled to the at least one second touch electrode pattern 11 via a second via-hole 21 at the second overlapping region.

Specifically, in addition to being able to couple the two adjacent second touch electrode patterns 11 in the same touch electrode row, the second conductive connection component 30 may further include an extension portion 31, the orthographic projection of the extension portion 31 onto the flexible base substrate overlaps the orthographic projection of at least one second touch electrode pattern 11 of the corresponding touch electrode group onto the flexible base substrate at a second overlapping region, so that the extension portion 31 is coupled to the at least one second touch electrode pattern 11 via a second via-hole 21 at the second overlapping region.

The second conductive connection component 30 above includes an extension portion 31, and is coupled to at least one corresponding second touch electrode pattern 11 through the extension portion 31, thereby effectively reducing the resistance of the entire touch electrode row. Therefore, it is more beneficial to reduce the loss of the touch electrode array when transmitting touch signals.

A touch display device is further provided in an embodiment of the present disclosure, including the touch substrate provided in the above embodiment.

Since the touch substrate provided by the above-mentioned embodiment may reduce the damage probability of the first touch electrode pattern 10 and the second touch electrode pattern 11 included in the touch electrode layer, weaken the influence of the slope angle of the first via-hole 20 on the coupling between the second touch electrode pattern 11 and the second conductive connection component 30, reduce the probability of disconnection between the second conductive connection component 30 and the second touch electrode pattern 11 caused by the bending operation, reduce the loss of the touch electrode array when transmitting touch signals, and makes the insulating layer in the touch substrate 40 not prone to be fractured when the touch substrate is bent at a larger angle, thereby ensuring that the touch substrate has a good touch performance and use yield. Therefore, the touch display device in the embodiments of the present disclosure including the touch substrate provided by the above embodiment also has the above-mentioned beneficial effects, which will not be repeated here.

It should be noted that the touch display device may be any product or component with a touch display function such as a TV, a monitor, a digital photo frame, a mobile phone, a tablet computer, etc.

In some embodiments of the present disclosure, the touch display device further includes a flexible display substrate, and the touch substrate and the flexible display substrate are stacked on the display side of the flexible display substrate.

Specifically, the touch display device in the above-mentioned embodiments may include a flexible display substrate and a touch substrate that are stacked, the touch substrate may be disposed on the display side of the flexible display substrate, and flexible base substrate of the touch substrate may be located between the flexible display substrate and the touch electrode layer.

The specific types of the above-mentioned flexible display substrates are various. Illustratively, the flexible display substrate includes an AMOLED (active matrix organic light emitting diode) display substrate, but is not limited to this.

In some embodiments of the present disclosure, the flexible display substrate is also used as a flexible base substrate of the touch substrate.

Specifically, the flexible display substrate may include a flexible base substrate, a display device, and an encapsulation layer arranged in a stacked manner. When the touch substrate is formed, the entire flexible display substrate may be reused as a flexible base substrate of the touch substrate, that is, the touch electrode layer is directly formed on the encapsulation layer of the flexible display substrate, and then the insulating layer 40 and the conductive connection component are formed on the touch electrode layer in sequence.

It is noted that the flexible base substrate in the flexible display substrate may also be reused as the flexible base substrate of the touch substrate, that is, the touch electrode layer, the insulating layer 40, and the conductive connection layer are formed inside the flexible display substrate.

The above-mentioned reusing of the flexible display substrate as a flexible base substrate of the touch substrate enables the touch display device to integrate flexible display and touch functions while minimizing the thickness of the touch display device.

A method of forming a touch substrate is further provided in an embodiment of the present disclosure, applied to form the touch substrate in some embodiments of the present disclosure hereinabove, including:

Step 1: forming a touch electrode layer on a flexible base substrate.

The touch electrode layer includes touch electrode columns and touch electrode rows arranged crosswise and insulated from each other; where each of the touch electrode columns includes a plurality of first touch electrode patterns 10 arranged in a column direction, two adjacent first touch electrode patterns 10 in an identical touch electrode column are coupled via a first conductive connection component in the touch electrode layer; each of the touch electrode rows includes a plurality of second touch electrode patterns arranged in a row direction, each of the touch electrode rows includes a plurality of touch electrode groups, and each touch electrode group includes two adjacent second touch electrode patterns 11 in the touch electrode row.

Step 2: forming an insulating layer 40 at a side of the touch electrode layer away from the flexible base substrate, and forming a plurality of first via-holes 20 in the insulating layer 40.

Step 3: forming a conductive connecting layer at a side of the insulating layer away from the flexible base substrate.

The conductive connecting layer includes a plurality of second conductive connection components, the touch electrode groups are in a one-to-one correspondence to the second conductive connection components, an orthographic projection of each of the two second touch electrode patterns of each touch electrode group onto the flexible base substrate overlaps an orthographic projection of the corresponding second conductive connection component onto the flexible base substrate at a first overlapping region, and each of the two second touch electrode patterns of each touch electrode group is coupled to the second conductive connection component via the first via-hole in the insulating layer at the first overlapping region.

Specifically, the specific shapes of the first touch electrode patterns 10 included in the touch electrode column and the second touch electrode patterns 11 included in the touch electrode rows are various, for example, both the first touch electrode pattern 10 and the second touch electrode pattern 11 are rectangular or diamond-shaped.

The first touch electrode pattern 10 and the second touch electrode pattern 11 are arranged in the same layer, and the first touch electrode pattern 10 and the second touch electrode pattern 11 are insulated from each other, and the touch electrode rows are insulated from each other, and the touch electrode columns are insulated from each other.

Two adjacent first touch electrode patterns 10 in the same touch electrode column may be directly coupled, that is, two adjacent first touch electrode patterns 10 in the same touch electrode column may be coupled via a first conductive connection component which is made of the same material and at the same layer with the first touch electrode pattern 10. The first conductive connection component may be formed in the same patterning process with the first touch electrode pattern 10, and a width of the first conductive connection component in the direction perpendicular to the column is smaller than that of the touch electrode pattern 10.

Two adjacent second touch electrode patterns 11 in the same touch electrode row may be coupled by a corresponding second conductive connection component 30, and the second conductive connection component 30 may also be referred to as a connecting bridge. The width of the second conductive connection component 30 in the direction perpendicular to the row is smaller than that of the second touch electrode pattern 11.

The touch electrode rows and the touch electrode columns may cross at any position. For example, the second conductive connection components 30 in each touch electrode row are in a one-to-one correspondence to the first conductive connection components in each touch electrode column, the orthographic projection of the second conductive connection component 30 onto the flexible base substrate overlaps the orthographic projection of the corresponding first conductive connection component onto the flexible base substrate, and the overlapping position is where the touch electrode row interests with the touch electrode column.

Each of the touch electrode rows includes a plurality of groups of touch electrode groups, and each group includes two adjacent second touch electrode patterns 11 in the touch electrode row, that is, in each touch electrode row, excepting for the second touch electrode patterns 11 located at two ends thereof, the remaining second touch electrode patterns 11 in the touch electrode row belong to two touch electrode groups. The second touch electrode patterns 11 may be coupled in the direction of touch electrode row through the second conductive connection components 30.

Since the second touch electrode pattern 11 and the second conductive connection portion 30 are arranged at different layers, an orthographic projection of each of the two second touch electrode patterns 11 of each touch electrode group onto the flexible base substrate overlaps an orthographic projection of the corresponding second conductive connection component 30 onto the flexible base substrate at a first overlapping region, and then each of the two second touch electrode patterns 11 of each touch electrode group is coupled to the second conductive connection component 30 via a first via-hole 20 penetrating the insulating layer 40 at the first overlapping region.

According to the touch substrate in the present disclosure, the touch substrate includes a touch electrode layer, an insulating layer 40 and a conductive connection layer that are sequentially stacked on the flexible base substrate in a direction away from the flexible base substrate. Since the touch electrode layer is disposed between the flexible base substrate and the insulating layer 40, the conductive connection layer is disposed on the surface of the insulating layer 40 away from the flexible base substrate, so that the touch electrode layer is closer to the flexible base substrate than the conductive connection layer, so that when the touch substrate needs to be bent during application, the touch electrode layer receives less bending stress, which reduces the damage probability of the first touch electrode pattern 10 and the second touch electrode pattern 11 included in the touch electrode layer; and although the conductive connection layer is far away from the flexible base substrate, the number of the second conductive connection portions 30 of the conductive connection layer is small and the distribution thereof is relatively sparse. Therefore, the probability of damage is also small when the touch substrate is bent.

In addition, in the touch substrate in the present disclosure, the touch electrode layer, the insulating layer 40, and the conductive connection layer are sequentially stacked on the flexible base substrate in a direction away from the flexible base substrate, so that when the second touch electrode pattern 11 in the touch electrode layer is coupled to the corresponding second conductive connection component 30 through the corresponding first via-hole 20, the influence of the slope angle of the via-hole 20 on the coupling between the second touch electrode pattern 11 and the second conductive connection portion 30 may be weakened, and the probability of disconnection between the second touch electrode pattern 11 and the second conductive connections 30 caused by the bending operation is reduced.

In some embodiments of the present disclosure, the insulating layer 40 includes an organic insulating layer, and the forming the first via-hole 20 on the insulating layer 40 includes:

Step 21: forming an organic insulating material film;

Step 22: exposing the organic insulating material film by a mask having a light-transmitting area and a light-shielding area, to form an organic insulating material film reserving area and an organic insulating material film removing area, where the organic insulating material film removing area corresponds to a region of the first via-hole, and the organic insulating material reserving area corresponds to other regions excepting the region of the first via-hole; and Step 23: developing the exposed organic insulating material film, to remove the organic insulating material film in the organic insulating material film removing area to form the organic insulating layer.

When the insulating layer 40 is an organic insulating layer, the forming the first via-hole 20 in the organic insulating layer specifically includes: first, an organic insulating material is used to make an organic insulating material film; then a mask including a light-transmitting area and a light-shielding area is aligned with the organic insulating material film, and the organic insulating material film is exposed by the mask, An organic insulating material film reserving area and an organic insulating material film removing area are formed. The organic insulating material film removing area corresponds to the area where the first via-hole 20 is located, and the organic insulating material reserving area corresponds to the area other than the area where the via-hole 20 is located. Finally, the exposed organic insulating material film is developed with a developer to remove the organic insulating material film located in the organic insulating material film removing area to form the organic insulating layer with the first via-hole 20.

In the touch substrate formed by the method in some embodiments of the present disclosure, the insulating layer 40 includes an organic insulating layer, so that the insulating layer 40 between the touch electrode layer and the conductive connection layer has a small film stress, even when the touch substrate is bent at a relatively large angle, the insulating layer 40 is not prone to be fractured. Moreover, when the insulating layer 40 includes an organic insulating layer, when the first via-hole 20 is formed in the organic insulating layer, only exposure and development processes are required, and no etching process is required, so that the forming of the slope angle of the first via-hole 20 is easier to be controlled, and the first via-hole 20 has a higher accuracy, so as to avoid the disconnection or poor contact between the second touch electrode pattern 11 and the second conductive connection component 30 when the slope angle of the first via-hole 20 is large, thereby ensuring that the touch substrate has good touch performance and usage yield.

It should be noted that the various embodiments in this specification are described in a progressive manner, and the same or similar parts between the various embodiments may be referred to each other, and each embodiment focuses on the differences from other embodiments. In particular, as for the method embodiment, since it is basically similar to the product embodiment, the description is relatively simple, and the relevant part may refer to the part of the description of the product embodiment.

Unless otherwise defined, the technical or scientific terms used in the present disclosure shall have the usual meanings understood by those with ordinary skills in the field to which the present disclosure belongs. The "first", "second" and similar words used in the present disclosure do not indicate any order, quantity, or importance, but are only used to distinguish different components. The "including" or "include" and other similar words mean that the elements or objects appearing in front of the word cover the elements or objects listed after the word and their equivalents, without excluding other elements or objects. Similar words such as "connected", "coupled" or "connected" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, region, or substrate is referred to as being "on" or "under" another element, the element may be "directly" "on" or "under" the other element. Or there may be intermediate elements.

In the description of the foregoing embodiments, specific features, structures, materials, or characteristics may be combined in any one or more embodiments or examples in an appropriate manner.

The above are only some embodiments of the present disclosure, but the scope of the present disclosure is not limited thereto. Any person skilled in the art may easily think of changes or substitutions within the scope disclosed by the present disclosure, and such changes or substitutions should be covered within the scope of the present disclosure. Therefore, the scope of the present disclosure should be subject to the scope of the claims.

What is claimed is:

1. A touch substrate, comprising:
   a flexible base substrate; and
   a touch electrode layer, an insulating layer and a conductive connection layer stacked in a direction away from the flexible base substrate; wherein
   the conductive connection layer comprises a plurality of second conductive connection components;
   the touch electrode layer comprises touch electrode columns and touch electrode rows arranged crosswise and insulated from each other;
   each of the touch electrode columns comprises a plurality of first touch electrode patterns arranged in a column direction, two adjacent first touch electrode patterns in an identical touch electrode column are coupled via a first conductive connection component in the touch electrode layer;
   each of the touch electrode rows comprises a plurality of second touch electrode patterns arranged in a row direction, each of the touch electrode rows comprises a plurality of touch electrode groups, each touch electrode group comprises two adjacent second touch electrode patterns in the touch electrode row, and the touch electrode groups are in a one-to-one correspondence to the second conductive connection components;
   an orthographic projection of each of the two second touch electrode patterns of each touch electrode group onto the flexible base substrate overlaps an orthographic projection of the corresponding second conductive connection component onto the flexible base substrate at a first overlapping region, and each of the two second touch electrode patterns of each touch electrode group is coupled to the second conductive connection component via a first via-hole in the insulating layer at the first overlapping region.

2. The touch substrate according to claim 1, wherein the insulating layer comprises an organic insulating layer.

3. The touch substrate according to claim 2, wherein the organic insulating layer comprises an organic resin layer.

4. The touch substrate according to claim 1, wherein
   each first touch electrode pattern comprises a plurality of layers of conductive metal sub-patterns stacked in a direction perpendicular to the flexible base substrate;
   each second touch electrode pattern comprises a plurality of layers of conductive metal sub-patterns stacked in the direction perpendicular to the flexible base substrate; and/or
   the second conductive connection component comprises a plurality of layers of conductive metal sub-patterns stacked in the direction perpendicular to the flexible base substrate.

5. The touch substrate according to claim 1, wherein the conductive connection layer further comprises an extension portion extending from each of the second conductive connection components, and an orthographic projection of the extension portion onto the flexible base substrate overlaps the orthographic projection of at least one second touch electrode pattern of the corresponding touch electrode group onto the flexible base substrate at a second overlapping region, and the extension portion is coupled to the at least one second touch electrode pattern via a second via-hole at the second overlapping region.

6. The touch substrate according to claim 1, wherein a width of the first conductive connection component in a first direction is smaller than a width of each first touch electrode pattern in the first direction, wherein the first direction is perpendicular to an extending direction of each of the touch electrode columns.

7. The touch substrate according to claim 1, wherein an orthographic projection of the first conductive connection component onto the flexible base substrate overlaps with the orthographic projection of the corresponding second conductive connection component onto the flexible base substrate.

8. The touch substrate according to claim 1, wherein a width of each second conductive connection component in a second direction is smaller than a width of each second touch electrode pattern in the second direction, wherein the second direction is perpendicular to an extending direction of each of the touch electrode rows.

9. The touch substrate according to claim 1, wherein each first touch electrode pattern comprises a first metal conductive layer and a second metal conductive layer which are arranged in a stacked manner.

10. The touch substrate according to claim 1, wherein each second touch electrode pattern comprises a third metal conductive layer and a fourth metal conductive layer which are arranged in a stacked manner, and/or each second conductive connection component comprises a fifth metal conductive layer and a sixth metal conductive layer which are arranged in a stacked manner.

11. A touch display device comprising the touch substrate according to claim 1.

12. The touch display device according to claim 11, wherein the insulating layer comprises an organic insulating layer.

13. The touch display device according to claim 12, wherein the organic insulating layer comprises an organic resin layer.

14. The touch display device according to claim 11, wherein
    each first touch electrode pattern comprises a plurality of layers of conductive metal sub-patterns stacked in a direction perpendicular to the flexible base substrate;
    each second touch electrode pattern comprises a plurality of layers of conductive metal sub-patterns stacked in the direction perpendicular to the flexible base substrate; and/or
    the second conductive connection component comprises a plurality of layers of conductive metal sub-patterns stacked in the direction perpendicular to the flexible base substrate.

15. The touch display device according to claim 11, wherein the conductive connection layer further comprises an extension portion extending from each of the second conductive connection components, and an orthographic projection of the extension portion onto the flexible base substrate overlaps the orthographic projection of at least one second touch electrode pattern of the corresponding touch electrode group onto the flexible base substrate at a second overlapping region, and the extension portion is coupled to the at least one second touch electrode pattern via a second via-hole at the second overlapping region.

16. The touch display device according to claim 11, wherein a width of the first conductive connection component in a first direction is smaller than a width of each first touch electrode pattern in the first direction, wherein the first direction is perpendicular to an extending direction of each of the touch electrode columns.

17. The touch display device according to claim 11, further comprising a flexible display substrate, wherein the touch substrate and the flexible display substrate are stacked at a display side of the flexible display substrate.

18. The touch display device according to claim 17, wherein the flexible display substrate is used as the flexible base substrate of the touch substrate.

19. A method of forming a touch substrate, applied to form the touch substrate according to claim 1, wherein the method comprises:
   forming a touch electrode layer on a flexible base substrate, wherein the touch electrode layer comprises touch electrode columns and touch electrode rows arranged crosswise and insulated from each other; wherein each of the touch electrode columns comprises a plurality of first touch electrode patterns arranged in a column direction, two adjacent first touch electrode patterns in an identical touch electrode column are coupled via a first conductive connection component in the touch electrode layer; each of the touch electrode rows comprises a plurality of second touch electrode patterns arranged in a row direction, each of the touch electrode rows comprises a plurality of touch electrode groups, and each touch electrode group comprises two adjacent second touch electrode patterns in the touch electrode row;
   forming an insulating layer at a side of the touch electrode layer away from the flexible base substrate, and forming a plurality of first via-holes in the insulating layer; and
   forming a conductive connection layer at a side of the insulating layer away from the flexible base substrate, wherein the conductive connection layer comprises a plurality of second conductive connection components, the touch electrode groups are in a one-to-one correspondence to the second conductive connection components, an orthographic projection of each of the two second touch electrode patterns of each touch electrode group onto the flexible base substrate overlaps an orthographic projection of the corresponding second conductive connection component onto the flexible base substrate at a first overlapping region, and each of the two second touch electrode patterns of each touch electrode group is coupled to the second conductive connection component via the first via-hole in the insulating layer at the first overlapping region.

20. The method according to claim 19, wherein the insulating layer comprises an organic insulating layer, and the forming the first via-holes in the insulating layer comprises:
   forming an organic insulating material film;
   exposing the organic insulating material film by a mask having a light-transmitting area and a light-shielding area, to form an organic insulating material film reserving area and an organic insulating material film removing area, wherein the organic insulating material film removing area corresponds to a region of the first via-hole, and the organic insulating material reserving area corresponds to other regions excepting the region of the first via-hole; and
   developing the exposed organic insulating material film, to remove the organic insulating material film in the organic insulating material film removing area to form the organic insulating layer.

* * * * *